(12) United States Patent
Lin

(10) Patent No.: US 7,357,256 B2
(45) Date of Patent: Apr. 15, 2008

(54) WAFER POD WITH WORKING SHEET HOLDER

(75) Inventor: Chia-Cheng Lin, Yungkun (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 179 days.

(21) Appl. No.: 11/242,701

(22) Filed: Oct. 4, 2005

(65) Prior Publication Data

US 2006/0219591 A1 Oct. 5, 2006

Related U.S. Application Data

(60) Provisional application No. 60/666,810, filed on Mar. 31, 2005.

(51) Int. Cl.
*B65D 85/48* (2006.01)

(52) U.S. Cl. .................. 206/710; 206/232; 206/454

(58) Field of Classification Search ........ 206/710–712, 206/454–456, 459.5, 232; 414/217, 217.1
See application file for complete search history.

(56) References Cited

U.S. PATENT DOCUMENTS

| 4,582,219 A | * | 4/1986 | Mortensen et al. | 206/454 |
| 5,165,546 A | * | 11/1992 | Jaeger et al. | 206/534 |
| 5,669,508 A | * | 9/1997 | Chen et al. | 206/710 |
| 5,678,693 A | * | 10/1997 | Tapp et al. | 206/454 |
| 6,098,809 A | * | 8/2000 | Okada et al. | 206/454 |

FOREIGN PATENT DOCUMENTS

JP 2004342844 12/2004

* cited by examiner

*Primary Examiner*—Luan K Bui
(74) *Attorney, Agent, or Firm*—Thomas, Kayden, Horstemeyer & Risley

(57) ABSTRACT

A wafer pod. The wafer pod comprises a main body, a working sheet holder disposed on the main body, and a lock disposed between the working sheet holder and the main body. The working sheet holder is fixed to the main body by the lock to form an accommodating space.

16 Claims, 6 Drawing Sheets

WAFER POD WITH WORKING SHEET HOLDER

CROSS REFERENCE TO RELATED APPLICATION

This application claims the benefit of U.S. Provisional Application No. 60/666,810, filed Mar. 31, 2005.

BACKGROUND

The invention relates to a wafer pod, and in particular to a wafer pod with a working sheet holder of simple structure and low cost.

In an 8-inch wafer fabrication, a pod is used to transport wafers. As the pod is 5 to 6 Kg weight, it can be carried manually. In a 12-inch wafer fabrication, wafers are loaded to a wafer pod named front opening unified pod (FOUP) and transported by an automated material handling system (AMHS). As shown in FIG. 1, a conventional FOUP 100 comprises an RF tag 20 on which certain information about the FOUP 100 is recorded for recognition by the AMHS. The FOUP 100 further comprises a smart tag device 30 with LCD display 32 displaying information about the FOUP 100, such as FOUP ID number and maintenance date. The smart tag 30 is, however, expensive, and may raise equipment cost. FOUP 100 further comprises a slot 34 in which a working sheet is inserted and a bag 40 in which a run card is received. As the slot 34 is formed by acrylic material and may be easily crushed into tiny particles polluting the wafer may be polluted. As the bag 40 is attached to the FOUP 100, it may fall when the attachment fails.

SUMMARY

An embodiment of a wafer pod comprises a main body, a working sheet holder disposed on the main body, and a lock disposed between the working sheet holder and the main body. The working sheet holder is fixed to the main body by the lock to form an accommodating space therebetween. The working sheet holder comprises an engaging portion engaging the main body. The engaging portion is Γ-shaped, and the main body comprises at least one block, whereby the Γ-shaped engaging portion engages the block to position the working sheet holder.

The working sheet holder comprises a slot formed on the front of the working sheet holder. A notch is formed on the edge of the slot.

The working sheet holder further comprises an opening and a holding plate extending from the bottom of the working sheet holder to abut the main body. An object is placed into the accommodating space from the opening and held on the holding plate. The working sheet holder further comprises a guide plate disposed on the edge of the opening to guide the object into the accommodating space. The guide plate extends downward and toward the main body.

The lock comprises a first locking portion fixed to the main body and a second locking portion fixed to the working sheet holder, whereby the working sheet holder is fixed to the main body. The first locking portion comprises at least one first screw hole into which a bolt is screwed, whereby the lock is fixed to the main body. The first locking portion comprises at least one first screw hole into which a bolt is screwed, whereby the lock is fixed to the main body. The first locking portion comprises at least one cylindrical first column on which the first screw hole is formed. In some embodiments, the first locking portion can comprise two cylindrical first columns separated by a first distance. The width of the opening is less than the first distance.

The second locking portion comprises at least one second screw hole into which a bolt is screwed, whereby the working sheet holder is fixed to the lock. The second locking portion comprises at least one cylindrical second column on which the second screw hole is formed. In some embodiments, the second locking portion comprises two cylindrical columns separated by a second distance which is larger than the first distance.

BRIEF DESCRIPTION OF THE DRAWINGS

The invention can be more fully understood by reading the subsequent detailed description and examples with references made to the accompanying drawings, wherein.

DETAILED DESCRIPTION

Figure 1:
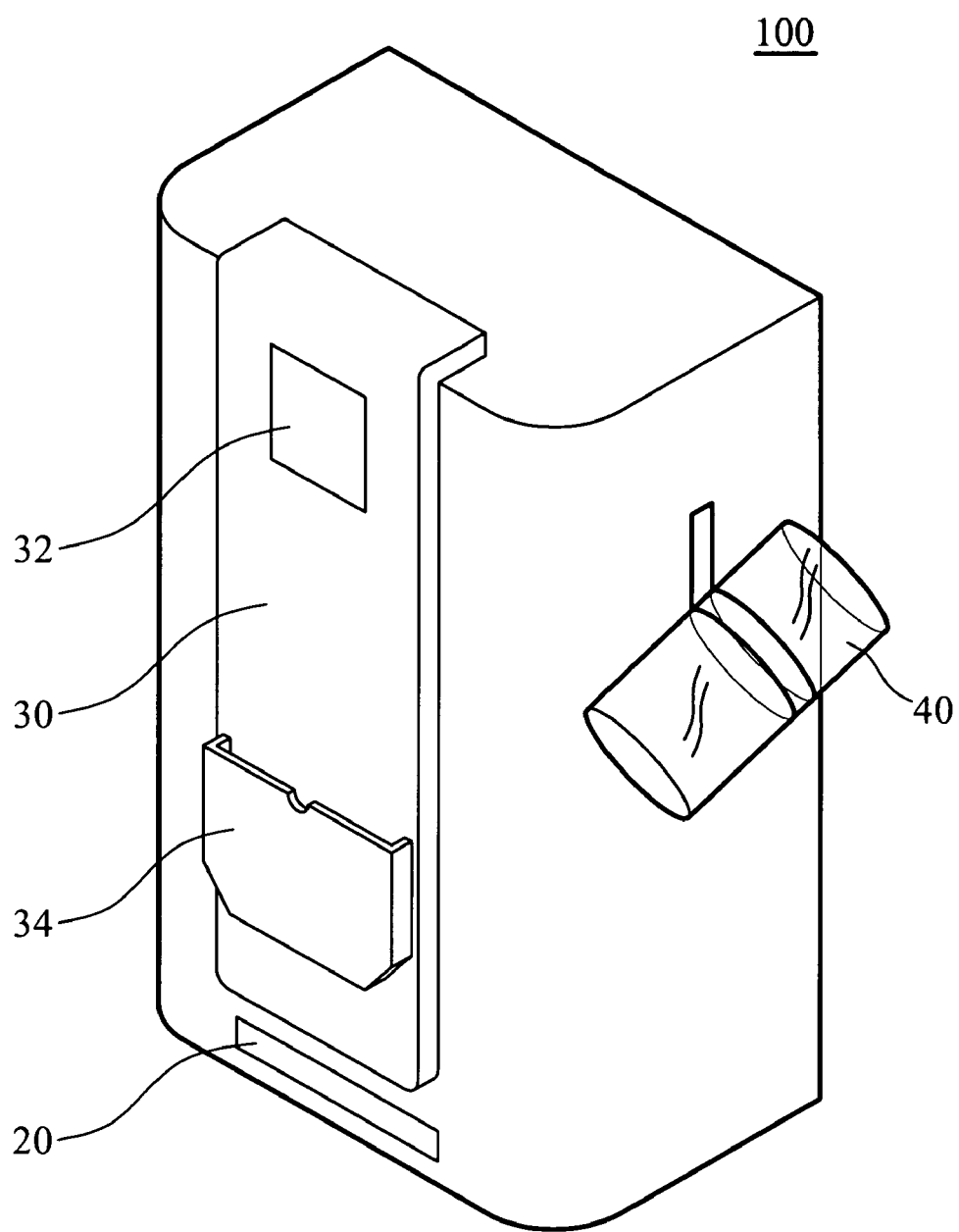
FIG. 1 is a schematic view of a conventional wafer pod.
Figure 2:
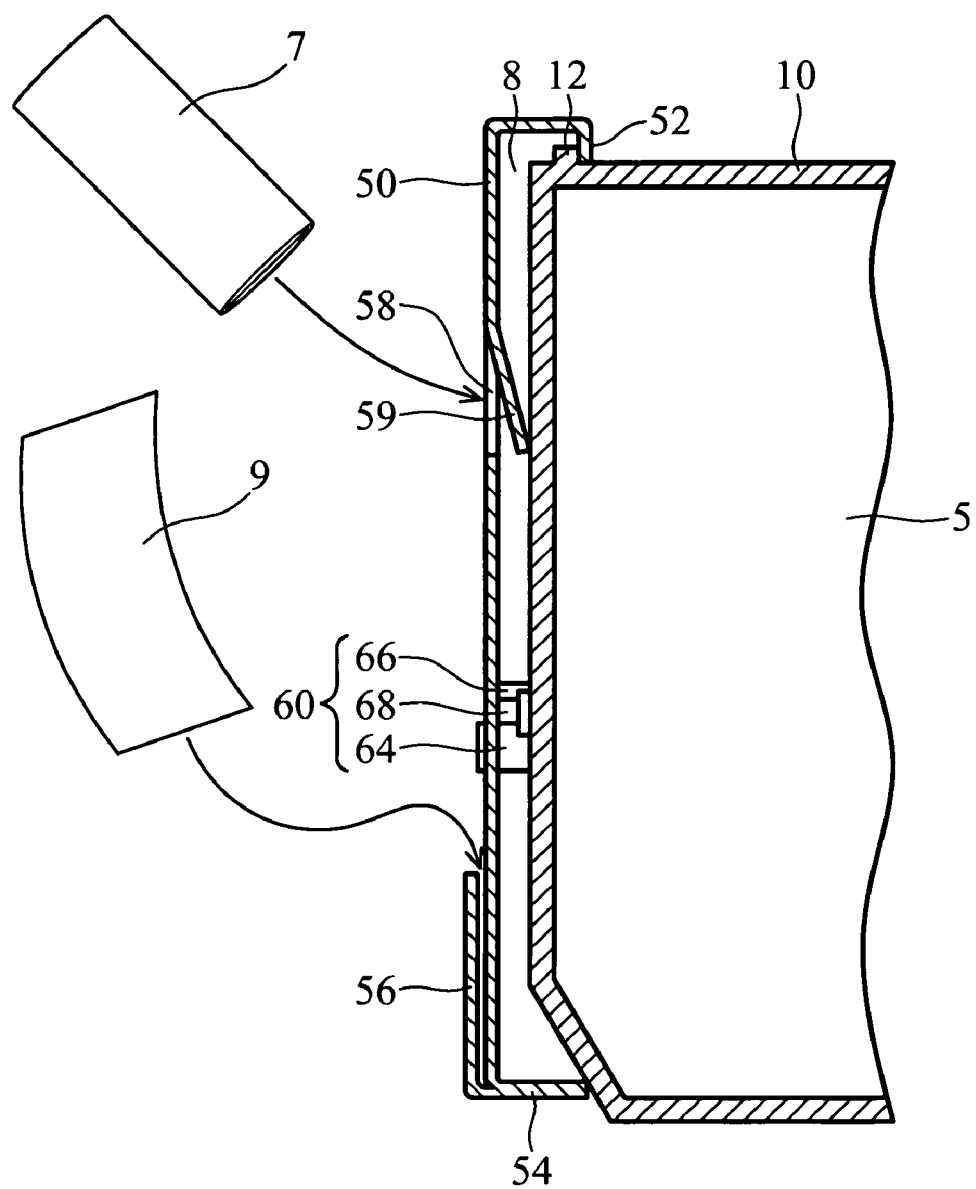
FIG. 2 is a cross section of an embodiment of a wafer pod.
Figure 3:
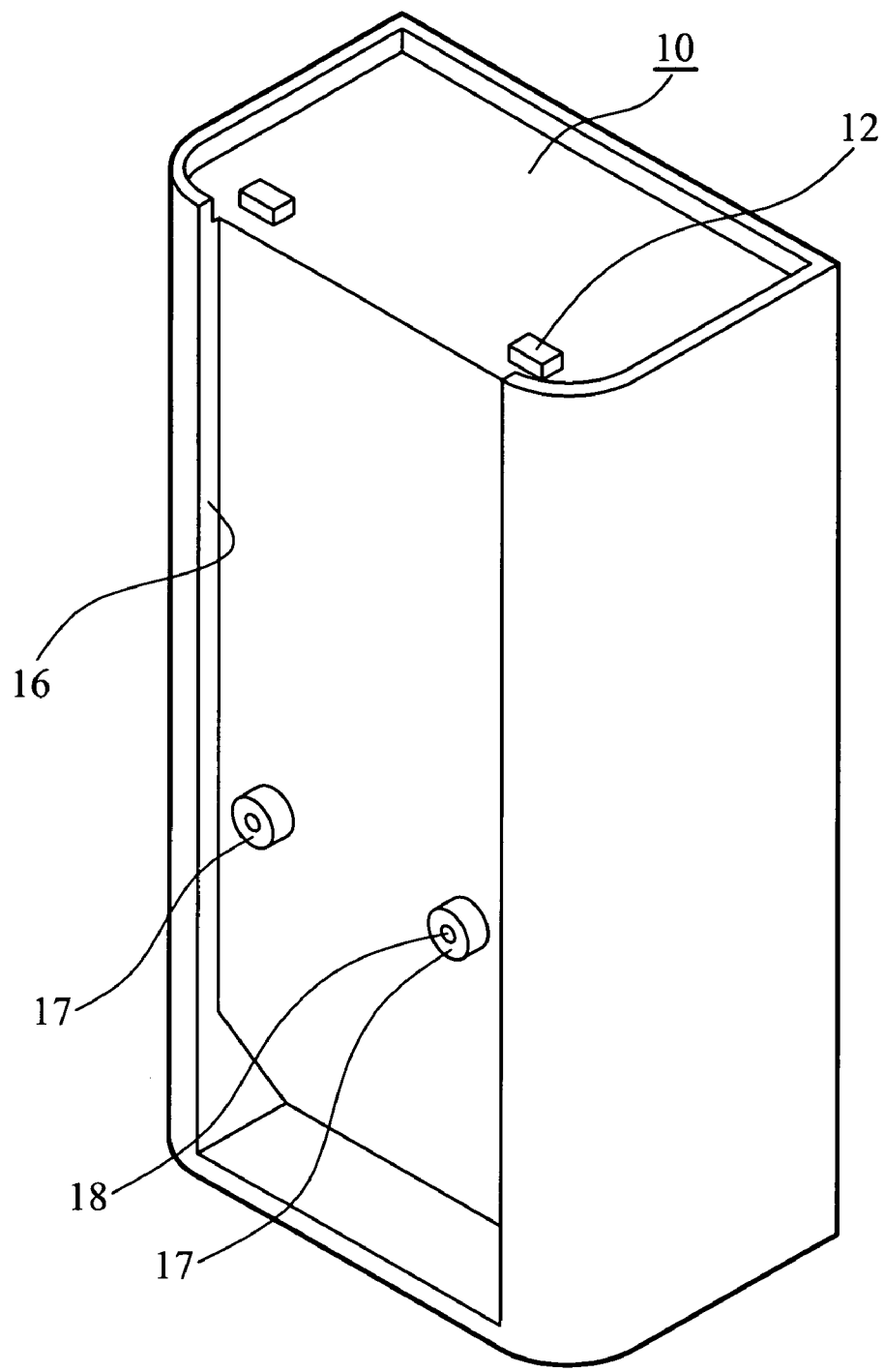
FIG. 3 is a schematic view of the main body of the wafer pod.

Referring to FIG. 2, a wafer pod 200 comprises a main body 10, a working sheet holder 50 and a lock 60. Wafers (not shown) are accommodated in a space 5 of the main body 10. FIG. 3 depicts the main body 10. The main body 10 comprises two blocks 12 on the top side thereof and a depression 16 on the front side thereof. Two protrusions 17 project from the depression 16. The working sheet holder 50 is disposed on the main body 10, and the lock 60 is disposed between the main body 10 and the working sheet holder 50, whereby the working sheet holder 50 is fixed to the main body 10.

Figure 4:
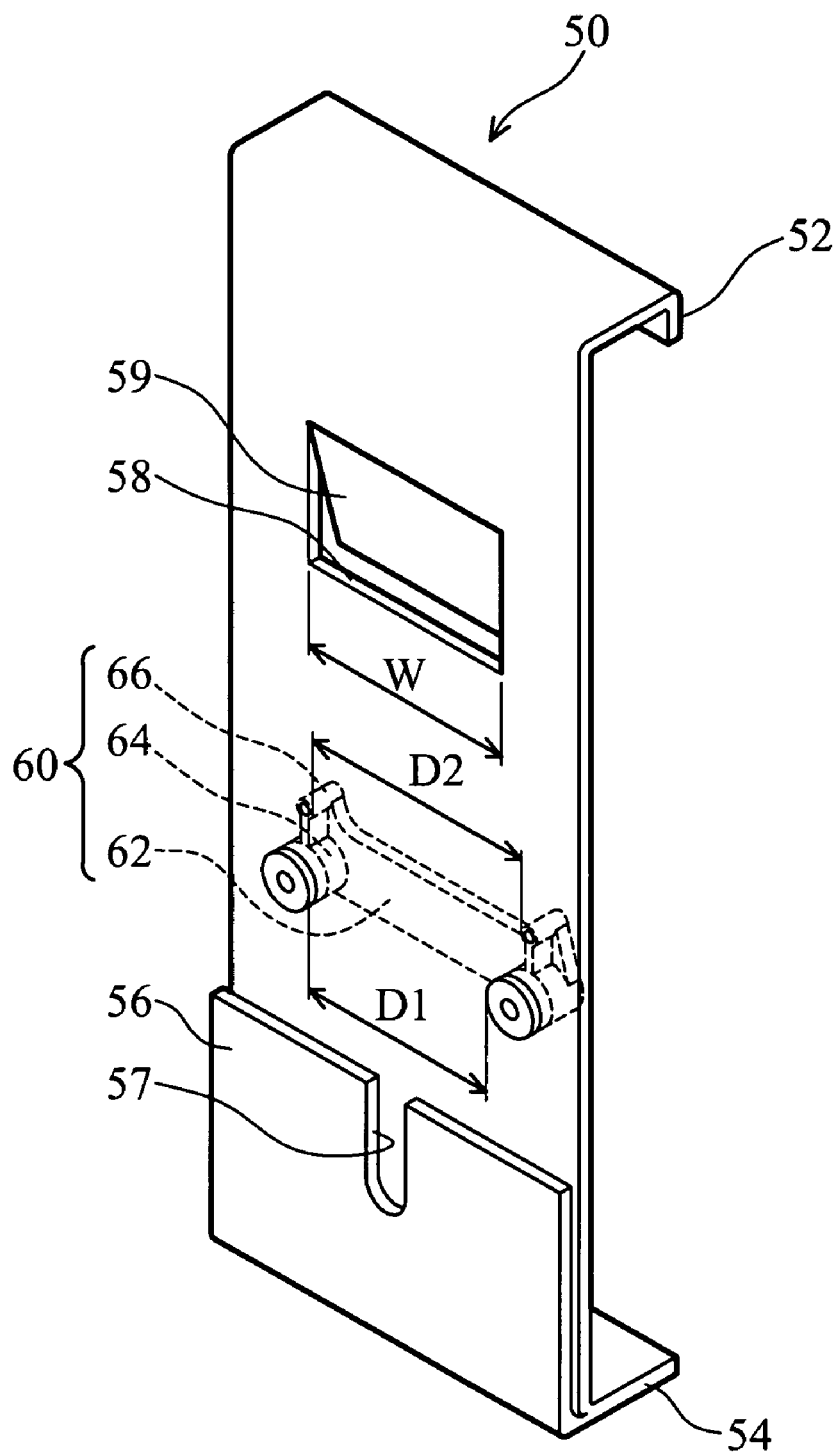
FIG. 4 is a perspective view of the assembled working sheet holder and the lock.
Figure 5:
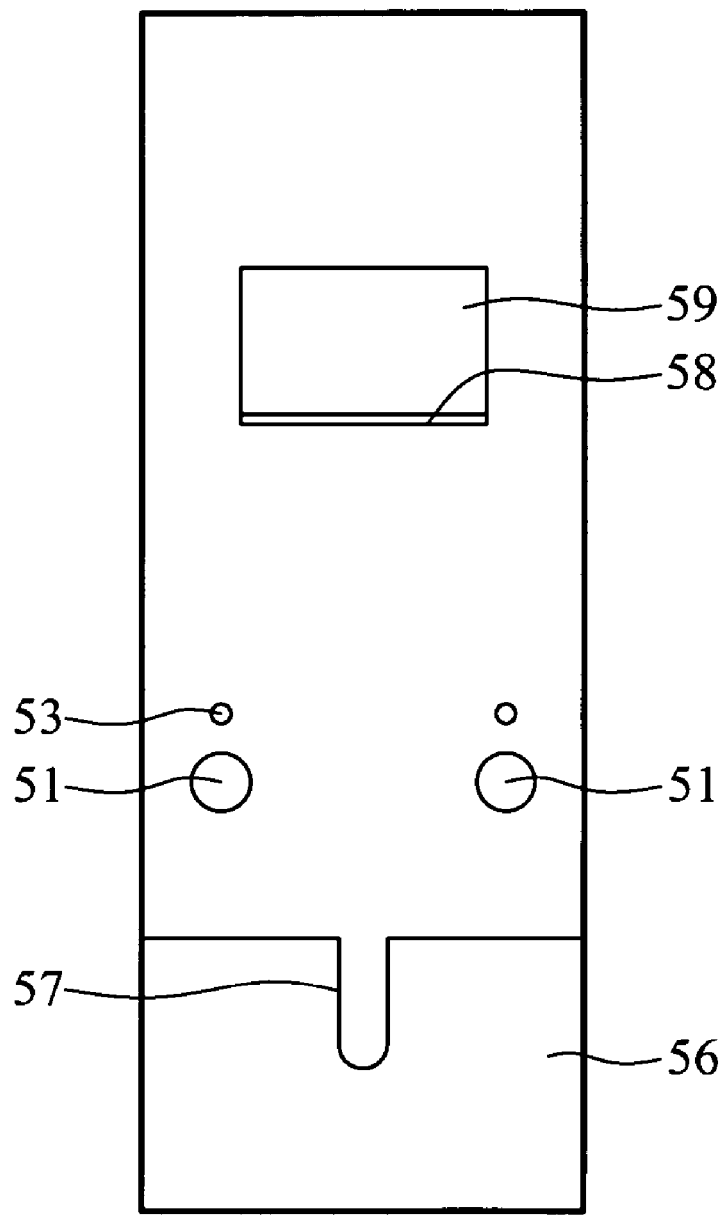
FIG. 5 is a front view of the working sheet holder of the invention.

Referring to FIGS. 4 and 5, the working sheet holder 50 comprises an engaging portion 52, a holding plate 54, a slot 56, an opening 58 and a guide plate 59. The engaging portion 52 is Γ-shaped and positioned on the top side of the working sheet holder 50. The holding plate 54 extends from the bottom side thereof and abuts the main body 10 when the working sheet holder 50 is mounted to the main body 10. The slot 56 is formed on the front side thereof. A notch 57 is formed on the edge of the slot 56. A document 9, such as a wafer working sheet, inserted into the slot 56, can easily be taken out with the aid of the notch 57. Another document 7, such as a run card, can be inserted into the opening 58. The guide plate 59 extends downward from the edge of the opening 58 and toward the main body 10, which guides the document 7 into the opening 58.

Figure 6:
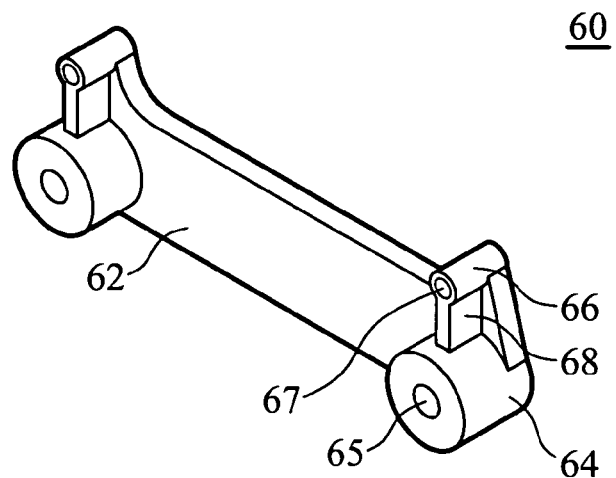
FIG. 6 is a perspective view of the lock of the invention.
Figure 7:
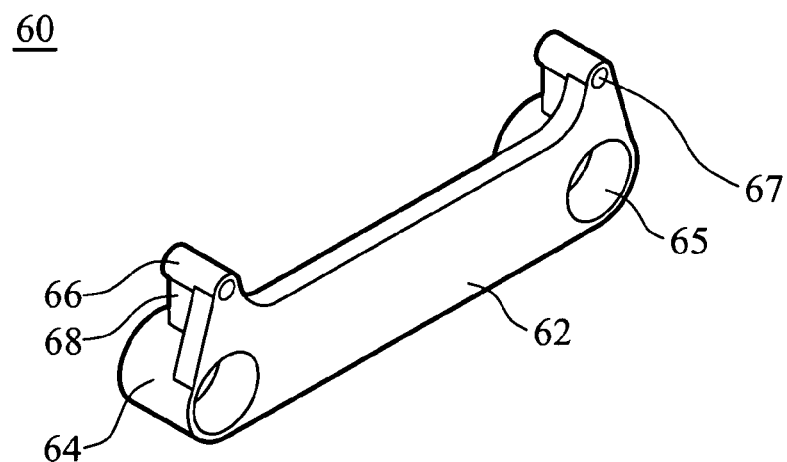
FIG. 7 is another perspective view of the lock of the invention.

Referring to FIGS. 6 and 7, the lock 60 comprises a main body 62, a first locking portion and a second locking portion. The first locking portion comprises two first columns 64 separated by a predetermined first distance D1. The first column 64 is cylindrical and comprises a hollow portion 63 as shown in FIG. 6. The second locking portion comprises two second columns 66 separated by a second distance D2 which is larger than the first distance D1. The second column 66 is also cylindrical. A first screw hole 65 is formed on the top of the first column 64, and a second screw hole 67 is formed on the top of the second column 66. In this embodiment, the diameter of the first column 64 is larger than that of the second column 66. A rib 68 connects the first and second columns 64 and 66.

Back to FIG. 2, two methods are used to secure the working sheet holder 50 to the main body 10. The first method joins the lock 60 to the main body 10 and joins the working sheet holder 50 to the lock 60 sequentially. The second method joins the working sheet holder 50 to the lock 60 and joins the assembly to the main body 10 sequentially.

In the first method, the hollow portion 63 engages the protrusion 17, whereby the lock 60 is positioned on the main body 10. A bolt is screwed into the first screw hole 65, whereby the lock 60 is fixed to the main body 10. The working sheet holder 50 is positioned on the main body 10 with the engaging portion 52 engaging the block 12. As the first column 64 is higher than the second column 66, the first column 64 extends through a through hole 51 (shown in FIG. 5) and protrudes from the working sheet holder 50. The second column 66 abuts the working sheet holder 50, and a bolt is screwed into the second screw hole 67 via a through hole 53 (shown in FIG. 5), whereby the working sheet holder 50 is fixed to the lock 60. Thus, the working sheet holder 50 is secured to the main body 10 and an accommodating space 8 is formed between the working sheet holder 50 and the depression 16.

In the second method, a bolt is screwed into the second screw hole 67 via the through hole 53, whereby the lock 60 is fixed to the working sheet holder 50. A bolt is screwed into the first screw hole 65 via the through hole 51, whereby the assembly of the working sheet holder 50 and the lock 60 is fixed to the main body 10.

The run card 7 can be inserted into the accommodating space 8 via the opening 58 and held by the holding plate 54. In this embodiment, the width W of the opening 58 is less than the first distance D1 to prevent the run card 7 from falling and being obstructed by the first column 64 when the run card 7 is folded to be shorter than the width W. As the second distance D2 is larger than the first distance D1, the second column 66 does not obstruct the falling run card 7.

Preferably, the material of the working sheet holder 50 is PVC to prevent from dispersal of tiny particles if the holder is crushed. The PVC can also prevent static electricity.

The information displayed in the smart tag of the conventional wafer pod can be moved to other instruments, for example the FOUP ID can be moved to the RF tag or stored in a laser mark attached to the main body 10, and the maintenance date can be moved to other devices. Thus, the need for expensive smart tag devices is eliminated.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer pod, comprising:
   a main body comprising at least one block;
   a working sheet holder disposed on the main body and comprising an engaging portion, which is Γ-shaped and engages the block to position the working sheet holder; and
   a lock disposed between the working sheet holder and the main body, wherein the working sheet holder is fixed to the main body and form an accommodating space therebetween.

2. The wafer pod as claimed in claim 1, wherein the working sheet holder comprises a slot formed in front of the working sheet holder.

3. The wafer pod as claimed in claim 2, wherein a notch is formed on the edge of the slot.

4. The wafer pod as claimed in claim 1, wherein the working sheet holder comprises an opening and a holding plate extending from the bottom of the working sheet holder to abut the main body, whereby the working sheet is inserted into the accommodating space from the opening to be held on the holding plate.

5. The wafer pod as claimed in claim 4, wherein the working sheet holder further comprises a guide plate disposed on the edge of the opening to guide the object into the accommodating space.

6. The wafer pod as claimed in claim 5, wherein the guide plate extends downward and toward the main body.

7. The wafer pod as claimed in claim 1, wherein the lock comprises a first locking portion fixed to the main body and a second locking portion fixed to the working sheet holder, whereby the working sheet holder is fixed to the main body.

8. The wafer pod as claimed in claim 7, wherein the first locking portion comprises at least one first screw hole into which a bolt is screwed, whereby the lock is fixed to the main body.

9. The wafer pod as claimed in claim 8, wherein the first locking portion comprises at least one cylindrical first column on which the first screw hole is formed.

10. The wafer pod as claimed in claim 9, wherein the first locking portion comprises two cylindrical first columns separated by a first distance.

11. The wafer pod as claimed in claim 10, wherein the working sheet holder comprises an opening, the width of the opening is smaller than the first distance.

12. The wafer pod as claimed in claim 7, wherein the second locking portion comprises at least one second screw hole into which a bolt is screwed, whereby the working sheet holder is fixed to the lock.

13. The wafer pod as claimed in claim 12, wherein the second locking portion comprises at least one cylindrical column on which the second screw hole is formed.

14. The wafer pod as claimed in claim 13, wherein the second locking portion comprises two cylindrical columns separated by a second distance.

15. The wafer pod as claimed in claim 14, wherein the second distance is larger than the second distance.

16. The wafer pod as claimed in claim 1, wherein the material of the working sheet holder comprises PVC.

* * * * *